US009630142B2

(12) United States Patent
Chen et al.

(10) Patent No.: US 9,630,142 B2
(45) Date of Patent: Apr. 25, 2017

(54) TOROIDAL PLASMA ABATEMENT APPARATUS AND METHOD

(71) Applicant: MKS Instruments, Inc., Andover, MA (US)

(72) Inventors: Xing Chen, Lexington, MA (US); Ilya Pokidov, North Reading, MA (US); Feng Tian, Salem, NH (US); Ken Tran, North Chelmsford, MA (US); David Lam, Fitchburg, MA (US); Kevin W. Wenzel, Belmont, MA (US)

(73) Assignee: MKS Instruments, Inc., Andover, MA (US)

(*) Notice: Subject to any disclaimer, the term of this patent is extended or adjusted under 35 U.S.C. 154(b) by 55 days.

(21) Appl. No.: 14/212,398

(22) Filed: Mar. 14, 2014

(65) Prior Publication Data
US 2014/0262746 A1 Sep. 18, 2014

Related U.S. Application Data

(60) Provisional application No. 61/783,360, filed on Mar. 14, 2013.

(51) Int. Cl.
*B01D 53/76* (2006.01)
*B01D 53/32* (2006.01)
(Continued)

(52) U.S. Cl.
CPC ........... *B01D 53/76* (2013.01); *B01D 53/323* (2013.01); *H01J 37/32339* (2013.01);
(Continued)

(58) Field of Classification Search
None
See application file for complete search history.

(56) References Cited

U.S. PATENT DOCUMENTS 5,773,919 A 6/1998 Seward
6,140,752 A 10/2000 Seward et al.
(Continued)

FOREIGN PATENT DOCUMENTS

JP 5-166595 7/1993
WO 8100862 A1 4/1981
WO 2006078340 A2 7/2006

OTHER PUBLICATIONS

Lee, W.K et al., "Characterization of Inductively Coupled Plasma Driven with Ferrite Cores at 400 kHS," GEC, Monterey, Dept. of Electrical Engineering, HanYang Univ. Seoul, Korea, 2005, 22 pages.
(Continued)

*Primary Examiner* — Kishor Mayekar
(74) *Attorney, Agent, or Firm* — Proskauer Rose LLP

(57) ABSTRACT

An apparatus for abatement of gases is provided. The apparatus includes a toroidal plasma chamber having a plurality of inlets and an outlet, and at least one chamber wall. One or more magnetic cores are disposed relative to the toroidal plasma chamber. The plasma chamber confines a toroidal plasma. A second gas inlet is positioned on the toroidal plasma chamber between a first gas inlet and the gas outlet at a distance d from the gas outlet, such that a toroidal plasma channel volume between the first gas inlet and the second gas inlet in the is substantially filled by the inert gas, the distance d based on a desired residence time of the gas to be abated.

9 Claims, 15 Drawing Sheets

(51) Int. Cl.
  *H01J 37/32* (2006.01)
  *H05H 1/46* (2006.01)
(52) U.S. Cl.
  CPC .. *H01J 37/32357* (2013.01); *H01J 37/32449* (2013.01); *H01J 37/32458* (2013.01); *H01J 37/32844* (2013.01); *H01J 37/32935* (2013.01); *H05H 1/46* (2013.01); *B01D 2257/2064* (2013.01); *H05H 2001/4667* (2013.01); *H05H 2245/121* (2013.01); *Y02C 20/30* (2013.01)

(56) References Cited

U.S. PATENT DOCUMENTS

| | | | |
|---|---|---|---|
| 6,156,667 | A | 12/2000 | Jewett |
| 6,361,706 | B1 | 3/2002 | Gabriel |
| 6,558,635 | B2 | 5/2003 | Minaee et al. |
| 6,815,633 | B1 | 11/2004 | Chen et al. |
| 6,924,455 | B1 | 8/2005 | Chen et al. |
| 8,518,162 | B2 | 8/2013 | Smith et al. |
| 2003/0007910 | A1* | 1/2003 | Diamant Lazarovich .......... B01D 53/326 422/186.18 |
| 2003/0071035 | A1* | 4/2003 | Brailove ................ H05B 6/108 219/672 |
| 2004/0079287 | A1 | 4/2004 | Smith et al. |
| 2007/0272299 | A1 | 11/2007 | Schuss et al. |
| 2008/0083701 | A1* | 4/2008 | Shao ................. H01J 37/32862 216/58 |
| 2008/0142729 | A1 | 6/2008 | Chen |
| 2009/0183684 | A1 | 7/2009 | Radoiu |
| 2010/0038230 | A1 | 2/2010 | Radoiu et al. |
| 2010/0065215 | A1 | 3/2010 | Jeon et al. |
| 2010/0071548 | A1* | 3/2010 | Smith .................... B01D 53/32 95/3 |
| 2010/0206847 | A1 | 8/2010 | Chen et al. |
| 2012/0031876 | A1 | 2/2012 | Shajii et al. |
| 2012/0034137 | A1 | 2/2012 | Risby |
| 2012/0034394 | A1 | 2/2012 | Shajii et al. |
| 2012/0035766 | A1 | 2/2012 | Shajii et al. |
| 2012/0279657 | A1 | 11/2012 | Srivastava et al. |

OTHER PUBLICATIONS

Lee, Kyeonghyo et al., "Characterization of a side-type ferrite inductively coupled plasma source for large-scale processing," Plasma Sources Sci. Technol. 17, IPO Publishing Ltd., 2008, pp. 1-6.

Godyak, Valery et al., "Distributed Ferromagnetic Inductively Coupled Plasma as an Alternative Plasma Processing Tool," Japanese Journal of Applied Physics, vol. 45, No. 10B, The Japanese Society of Applied Physics, 2006, pp. 8035-8041.

Freidberg, J.P. et al., "An Electrodeless Melter for Vitrification of Nuclear Waste," Mat. Res. Soc. Symp. Proc., vol. 465, Materials Research Society, 1997, pp. 33-38.

* cited by examiner

TOROIDAL PLASMA ABATEMENT APPARATUS AND METHOD

CROSS REFERENCE TO RELATED APPLICATIONS

This application claims the benefit of and priority to U.S. Provisional Patent Application No. 61/783,360, filed Mar. 14, 2013, the entire contents of which is owned by the assignee of the instant application and incorporated herein in its entirety.

FIELD OF THE INVENTION

The invention relates generally to the field of process gas abatement. More specifically, the invention relates to apparatuses for and methods of abating process gas using a toroidal plasma.

BACKGROUND OF THE INVENTION

In semiconductor processes such as etching and chemical vapor deposition, chemically reactive gases can be used during processing or produced as a result of processing. These toxic or otherwise harmful process gases can be treated or abated before their release to atmosphere. A number of technologies have traditionally been used for the abatement of such gases. For example, thermal abatement processes are commonly implemented by burning halogen-containing gases with a hydrogen-containing fuel to convert fluorine (F) or chlorine (Cl) to hydrogen fluoride (HF) or hydrogen chloride (HCl). In those exemplary processes, the resulting HF or HCl can be subsequently removed in a wet scrubber.

Another example of current abatement processes is catalytic thermal abatement. Catalytic thermal abatement is typically performed by exposing halogen-containing gases to metal oxides at high temperatures to convert halogen to salts. Another example is plasma abatement, which can be performed at sub-atmospheric pressures, or at atmospheric pressure using microwave plasmas.

In current thermal abatement processes, energy usage can be inefficient. Many of the halogen-containing compounds can be chemically stable, requiring temperatures (e.g., of 1000K to 2000K) to achieve thermal abatement. For example, this difficulty can occur in the abatement of highly stable carbon tetrafluoride (CF4).

Current thermal abatement processes conducted at atmospheric pressure can require large amounts of purge gas to be added at vacuum pumps of the plasma device for protection of the pumps. As a result, a high level of energy can be wasted just in heating the purge gas.

Catalytic thermal abatement processes can achieve higher abatement efficiency, but still can suffer from high maintenance cost and high consumable cost. During semi-conductor processing the flow of halogen-containing gases is often not continuous, toggling on and off in each wafer cycle. Since the thermal time constant of a burner to reach operating temperature can be much longer than a wafer cycle, a thermal abatement unit is often kept on continuously, dramatically reducing the energy efficiency.

In plasma abatement, existing technologies have demonstrated high abatement efficiency (e.g., greater than 95%). Plasmas can be generated in various ways including DC discharge, radio frequency (RF) discharge, and microwave discharge. DC discharges are achieved by applying a potential between two electrodes in a gas. RF discharges are achieved either by electrostatically or inductively coupling energy from a power supply into a plasma. Parallel plates are typically used for electrostatically coupling energy into a plasma. Induction coils are typically used for inducing current into a plasma. Microwave discharges are achieved by directly coupling microwave energy through a microwave-passing window into a discharge chamber containing a gas.

The existing technologies, e.g., either inductively coupled plasma or microwave plasmas, can have a limited operating range. To achieve high abatement efficiency, gases to be abated are typically excited and reacted in the plasma. It is desirable for the plasma to cover as much of the gas flow path as possible such that gas molecules cannot bypass the plasma region without interacting with the plasma.

During abatement, a pressure increase can be generated, for example, due to restrictions to the gas flow path. Since an abatement device is often located downstream of a process chamber in which the gases to be abated are used and/or generated, a pressure rise in the abatement device can directly impact the processes in the process chamber. Therefore, it is desirable to limit pressure rises during abatement.

Existing plasma abatement devices can suffer from limited ranges of gas flow rate and operating pressure. They can suffer from surface erosions due to, for example, reactive plasma chemistries and high energy ions generated in the plasma sources.

SUMMARY OF THE INVENTION

One advantage of the invention is that it provides a high flow conductance of the plasma source for abatement of process gases due to, for example, the shape and configuration of the plasma channel (e.g., greater than 500 L/s). Another advantage is that the residence time of the process gas to be abated can be adjusted and optimized. Gas residence time in plasma can be critical to abatement efficiency. For example, too short of a residence time can result in insufficient gas-plasma interactions and lower abatement rate, while too long a residence time can result in overheating of gases and lower energy efficiency. Another advantage of the invention is that its topology allows for structural scalability, such that plasma channel dimensions can be sized to accommodate a wide range of process requirements and/or facilitate efficient abatement performance. Gas inlet and outlet fittings can be scalable to, for example, match user pumping equipment, allowing for easier integration into existing semiconductor fabrication systems. A further advantage of the invention is a low erosion of the plasma chamber surface due to low electric fields in a toroidal plasma source.

Another advantage of the invention is a high abatement efficiency of greater than 95% achieved with a high energy efficiency in operation (e.g. 3-6 kW for 100-200 sccm of CF4), in the abatement of the highly stable CF4. Another advantage of the invention is a broad operating pressure range, from 0.1 Torr to tens of Torrs, and in some cases, up to atmospheric pressure. Another advantage of the invention is a low pressure drop of less than or equal to 0.1 Torr. Parameters such as high energy efficiency and low pressure drop in an abatement system can lead to improved product lifetime, fast response to changing gas flow rates, and lower capital and operation costs of the abatement apparatus.

In one aspect, the invention includes an apparatus for abatement of gases. The apparatus includes a plasma chamber having a first gas inlet receiving an inert gas for ignition into a plasma, a second gas inlet receiving a gas to be abated, a gas outlet, and at least one chamber wall for containing the gas. One or more magnetic cores are disposed relative to the toroidal plasma chamber such that the toroidal plasma chamber passes through each of the one or more magnetic cores. A primary winding is coupled to the one or more magnetic cores. The plasma chamber confines a toroidal plasma. The toroidal plasma extends along a plane extending through the plasma chamber. The second gas inlet is positioned on the toroidal plasma chamber between the first gas inlet and the gas outlet at a distance d along the plane from the gas outlet, such that a toroidal plasma channel volume between the first gas inlet and the second gas inlet in the is substantially filled by the inert gas. The distance d is based on a desired residence time of the gas to be abated.

In some embodiments, the distance d that is along the plane is approximately 2 to 5 inches. In some embodiments, the second gas inlet is a series of selectable gas inlet ports positioned along the toroidal plasma chamber. In various embodiments, the gas to be abated is mixed with one or more reactant gases prior to entering the plasma chamber. In some embodiments, the one or more reactant gases mixed with the gas to be abated is a water vapor.

In various embodiments, the apparatus includes a sensor positioned relative to the gas outlet and configured to monitor an emission from the plasma chamber. In various embodiments, the sensor includes an optical and/or an infrared sensor.

In some embodiments, the gas to be abated is mixed with one or more reactant gases prior to entering the plasma chamber. In some embodiments, the one or more reactant gases mixed with the gas to be abated is a water vapor. In various embodiments, the gas to be abated received by the second gas inlet is a chlorine compound. In some embodiments, the gas to be abated received by the second gas inlet is a perfluorocarbon compound. In various embodiments, the perfluorocarbon compound received by the second gas inlet includes carbon tetrafluoride.

In another aspect, the invention includes a method for abating process gas within a plasma chamber. The method involves flowing via a first gas inlet, a first gas for ignition into a plasma into a toroidal plasma chamber having a primary winding coupled to the plasma chamber and a plurality of magnetic cores oriented such that the plasma chamber passes through each of the plurality of magnetic cores. The method also involves generating a toroidal plasma in the plasma chamber along a plane extending through the plasma chamber. The method also involves positioning a second gas inlet between the first gas inlet and a gas outlet along the plasma chamber at a distance d from the gas outlet along the plane, the distance d based on a desired residence time of a gas to be abated. The method further involves flowing via the second gas inlet, the gas to be abated into the plasma chamber such that the gas to be abated reacts with the toroidal plasma.

In some embodiments, the method further involves adjusting the position of the second gas inlet to control the desired residence time of the gas to be abated. In various embodiments, the method further involves adjusting a flow rate of the first gas flowing into the plasma chamber such that a toroidal plasma channel volume between the first gas inlet and the second gas inlet in the toroidal plasma channel is substantially filled by the first gas. In some embodiments, the method further involves providing an reactant gas to mix with the gas to be abated before flowing into the plasma chamber via the second gas inlet. Further, in various embodiments, the method involves monitoring an emission from the plasma chamber via an optical and/or an infrared sensor and adjusting a flow rate of the reactant gas in response to the emission from the plasma chamber such that a concentration of the reactant gas is at a desired level to react with the gas to be abated. In some embodiments, the method involves coupling the gas outlet to a subsequent treatment device.

In another aspect, the invention includes an apparatus for abatement of gases. The apparatus includes a plasma source having a gas inlet directing a gas to be abated along a gas flow path, a gas outlet, and at least one chamber wall for containing the gas. The apparatus also includes a toroidal plasma channel oriented along a plane extending through the plasma source, the toroidal plasma channel having a toroidal plasma channel inlet portion, a main toroidal plasma channel portion, and a toroidal plasma channel outlet portion, the toroidal plasma channel inlet portion and the toroidal plasma channel outlet portion each having a width that is less than a width W of the main toroidal plasma channel portion. One or more magnetic cores disposed relative to the toroidal plasma source such that the toroidal plasma channel passes through each of the one or more magnetic cores. A primary winding is coupled to the one or more magnetic cores. The plasma source generates a toroidal plasma along the plane extending through the plasma source and confined in the toroidal plasma channel.

In some embodiments, the gas inlet is oriented such that the gas flow path is substantially perpendicular to the plane extending through the plasma source. In some embodiments, the width W of the main toroidal plasma channel portion is approximately equal to a cross-sectional diameter of the toroidal plasma.

In some embodiments, the gas inlet comprises a curved portion that reduces friction and drag of the gas to be abated flowing into the toroidal plasma channel. Further, in various embodiments, the curved portion of the gas inlet is spherically blunted cone.

In some embodiments, a major diameter of the toroidal plasma channel is greater than or equal to the diameter of the gas inlet. In various embodiments, the diameter of the gas inlet is between approximately 1 and 10 inches.

In some embodiments, the gas to be abated is mixed with one or more reactant gases prior to entering the toroidal plasma channel. In various embodiments, the toroidal plasma channel comprises at least one metal layer to shield the toroidal plasma from electrostatic coupling. In some embodiments, one or more dielectric gaps are positioned along the toroidal plasma channel to prevent an induced electric current from flowing in the toroidal plasma channel.

In another aspect, the invention includes a method for abating process gas within a plasma source. The method involves directing via a gas inlet a gas to be abated along a gas flow path into a plasma source having a primary winding coupled to the plasma source and a plurality of magnetic cores positioned such that a toroidal plasma channel oriented along a plane extending through the plasma source passes through each of the plurality of magnetic cores. The method also involves generating a toroidal plasma along the plane extending through the plasma source and confined in the toroidal plasma channel. The method also involves positioning the gas inlet such that the gas flow path is substantially perpendicular to the plane extending through the plasma source. Further, the method also involves flowing the gas to be abated into the toroidal plasma channel such that the gas to be abated interacts with a main body of the toroidal plasma having a high electron density.

In various embodiments, the method also involves providing one or more reactant gases to mix with the gas to be abated prior to the gases entering the toroidal plasma channel. In some embodiments, the method involves positioning one or more dielectric gaps along the toroidal plasma channel to prevent an induced electric current from flowing in the toroidal plasma channel.

BRIEF DESCRIPTION OF THE DRAWINGS

The advantages of the invention described above, together with further advantages, can be better understood by referring to the following description taken in conjunction with the accompanying drawings. The drawings are not necessarily to scale, emphasis instead generally being placed upon illustrating the principles of the invention.

DETAILED DESCRIPTION

Figure 1:
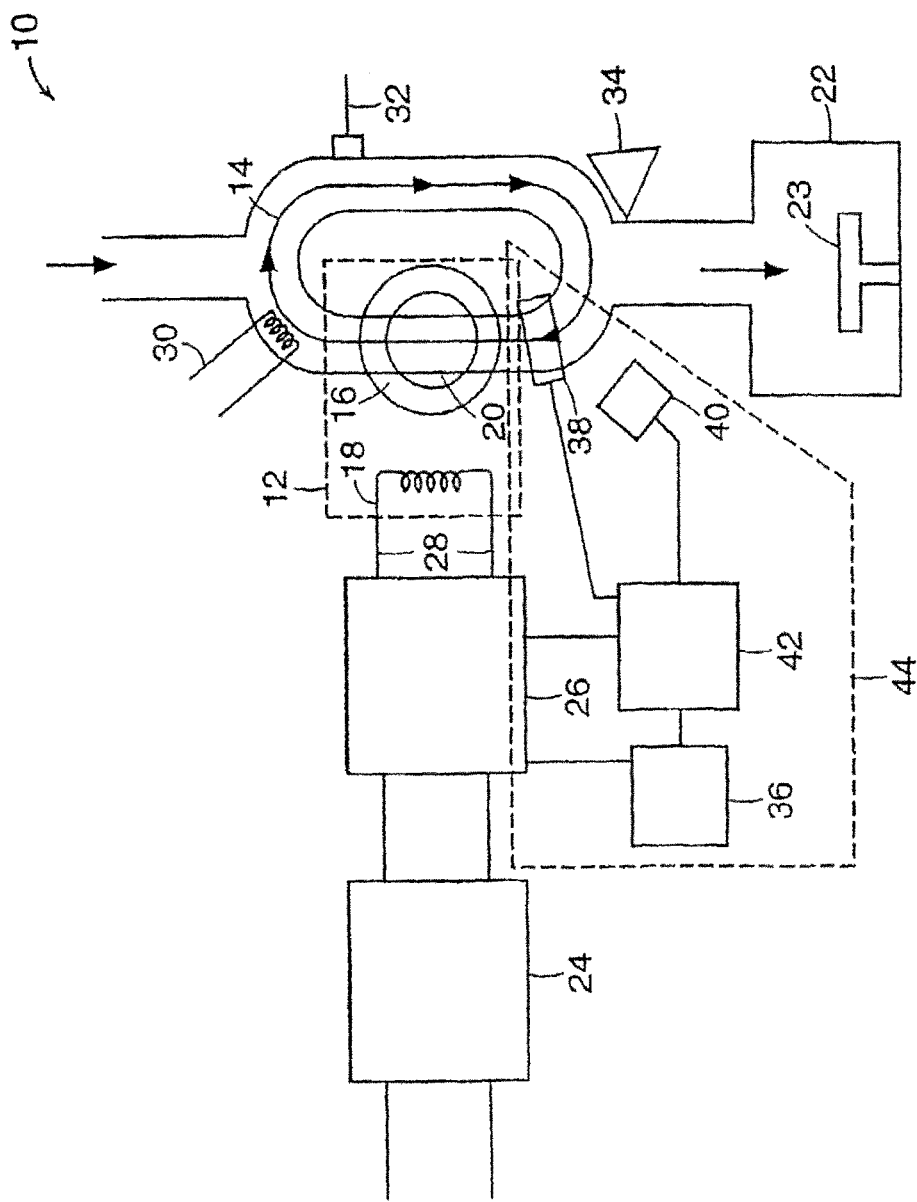
FIG. 1 is a schematic representation of a plasma source for producing activated gases, according to an illustrative embodiment of the invention.

FIG. 1 is a schematic representation of a plasma source for producing activated gases, according to an illustrative embodiment of the invention. The source 10 includes a power transformer 12 that couples electromagnetic energy into a plasma 14. The power transformer 12 includes a high permeability magnetic core 16, a primary coil 18, and a plasma chamber 20 that contains the plasma 14, which allows the plasma 14 to form a secondary circuit of the transformer 12. The power transformer 12 can include additional magnetic cores and primary coils (not shown) that form additional secondary circuits.

One or more sides of the plasma chamber 20 are exposed to a process chamber 22 to allow charged particles and activated gases generated by the plasma 14 to be in direct contact with a material to be processed (not shown). A sample holder 23 can be positioned in the process chamber 22 to support the material to be processed. The material to be processed can be biased relative to the potential of the plasma.

A voltage supply 24, which can be a line voltage supply or a bus voltage supply, is directly coupled to a switching circuit 26 containing one or more switching semiconductor devices. The one or more switching semiconductor devices can be switching transistors. The circuit can be a solid state switching power supply. An output 28 of the switching circuit 26 can be directly coupled to the primary winding 18 of the transformer 12.

The toroidal low field plasma source 10 can include an apparatus for generating free charges that provides an initial ionization event that ignites a plasma in the plasma chamber 20 as described herein. An inert gas, such as argon, can also be inserted into the plasma chamber 20 to reduce the voltage required to ignite a plasma. Free charges can be generated in numerous ways as described herein. For example, free charges can be generated by applying a short high voltage pulse to an electrode inside of the plasma chamber 20. Also, free charges can be generated by applying a short high voltage pulse directly to the primary coil 18. A high electric voltage signal can be applied to an electrode, located outside of a dielectric plasma chamber 20 but capacitively coupled to the plasma volume, to generate free charges to assist ignition in the plasma chamber 20.

In another embodiment, an ultraviolet light source 34 is used to generate free charges that provide an initial ionization event, which ignites a plasma in the plasma chamber 20. The ultraviolet (UV) light source 34 is optically coupled to the plasma chamber 20. The UV light source 34 can be optically coupled to the plasma channel through an optically transparent window. The UV light source 34 can either be a continuous wave (CW) light source or a pulsed light source depending on the duty cycle of the plasma source.

The toroidal low field plasma source 10 can also include a measuring circuit 36 for measuring electrical parameters of the primary winding 18. Electrical parameters of the primary winding 18 include the current driving the primary winding 18, the voltage across the primary winding 18, the bus or line voltage that is generated by the voltage supply 24, the average power in the primary winding 18, and the peak power in the primary winding 18. The electric parameters of the primary winding can be continuously monitored.

The plasma source 10 can also include an apparatus for measuring electrical and optical parameters of the plasma 14 itself. For example, the source 10 can include a current probe 38 that is positioned around the plasma chamber 20 to measure the plasma current flowing in secondary of the transformer 12. Also, the voltage on the plasma secondary can be measured, for example, by positioning a secondary winding on the magnetic core parallel to the plasma 14. Alternatively, the electric power applied to the plasma can be determined from measurements of the AC line voltage and current and from known losses in the electric circuit.

The plasma source 10 can also include an optical detector 40 for measuring the optical emission from the plasma 14. The electric and optical parameters of the plasma 14 can be continuously monitored. In addition, the plasma source 10 can include a power control circuit 42 that accepts data from at least one of the current probe 38, the power detector 40, and the switching circuit 26 and then adjusts the power in the plasma by adjusting the current in the primary winding 18.

In operation, a gas is bled into the plasma chamber 20 until a pressure that is substantially between 1 mTorr and 100 Torr is reached. In some embodiments, a gas is bled into the chamber 20 until a pressure that is between about 0.1 mTorr and about 1,000 Torr is reached. The gas can comprise an inert gas, a reactive gas or a mixture of at least one inert gas and at least one reactive gas. The switching circuit 26 containing switching semiconductor devices that supply a current to the primary winding 18 that induces a potential inside the plasma chamber 20.

The magnitude of the induced potential can depend on the magnetic field produced by the magnetic core 16 and the frequency at which the switching semiconductor devices operate according to Faraday's law of induction. An ionization event that forms the plasma can be initiated in the chamber 20. The ionization event can be the application of a voltage pulse to the primary winding or to the electrode 30 positioned in the chamber 20 as described herein. Alternatively, the ionization event can be exposing the inside of the plasma chamber 20 to ultraviolet radiation.

Once the gas is ionized, a plasma is formed in the plasma chamber 20 that completes a secondary circuit of the transformer 12. The circumference length of the toroidal plasma chamber 20 can be from 10 to 40 inches. The shape of the cross sectional area of the plasma chamber 20 can vary from circular to non-circular (oval, etc.). In one embodiment, the diameter of a circular plasma chamber 20 can vary from approximately 0.5 to 2.0 inches depending upon the operating conditions. Changing the circumference length or cross-sectional diameter of the plasma chamber 20 can change the gas flow dynamics and the plasma impedance and allows the plasma source to be optimized for different operating ranges (i.e. different power levels, pressures ranges, gases, and gas flow rates).

The electric field of the plasma can be substantially between about 1-100 V/cm. If only inert gases are present in the plasma chamber 20, the electric fields in the plasma 14 can be as low as 1 volt/cm. If, however, electronegative gases are present in the plasma chamber 20, then the electric fields in the plasma 14 are considerably higher. In some embodiments, operating the plasma source 10 with low electric fields in the plasma 14 is desirable because a low potential difference between the plasma 14 and the chamber 20 will substantially reduce erosion of the chamber 20 caused by energetic ions. This will substantially reduce the resulting contamination to the material being processed. Reducing erosion of the chamber 20 is not required in some embodiments.

The power delivered to the plasma can be controlled by a feedback loop 44 that comprises the power control circuit 42, the measuring circuit 36 for measuring electrical parameters of the primary winding 18 and the switching circuit 26 containing one or more switching semiconductor devices. In addition, the feedback loop 44 can include the current probe 38 and optical detector 40.

In one embodiment, the power control circuit 42 measures the power in the plasma using the measuring circuit 36 for measuring electrical parameters of the primary winding 18. The power control circuit 42 compares the resulting measurement to a predetermined value representing a desired operating condition and then adjusts one or more parameters of the switching circuit 26 to control the power delivered to the plasma. The one or more parameters of switching circuit 26 include, for example, voltage and current amplitude, frequency, pulse width, and relative phase of the drive pulses to the one or more switching semiconductor devices.

In another embodiment, the power control circuit 42 measures the power in the plasma using the current probe 38 or the optical detector 40. The power control circuit 42 then compares the measurement to a predetermined value representing a desired operating condition and then adjusts one or more parameters of the switching circuit 26 to control the power delivered to the plasma.

In one embodiment, the plasma source 10 can include protection circuits to ensure that the plasma source 10 is not damaged either through abnormal environmental conditions or through abnormal usage. The temperature of the plasma source 10 can be monitored at numerous locations to ensure that an appropriate amount of cooling fluid is flowing and that an abnormally high amount of power is not being dissipated in the source. For example, the temperature of the mounting blocks for the switching devices, the plasma chamber 20 itself, and the magnetic core can be monitored. Also, the current flowing though the FET devices can be monitored. If the current exceeds predetermined values the plasma source 10 can be shut down, thereby protecting the switching devices against possible damage.

Figure 2:
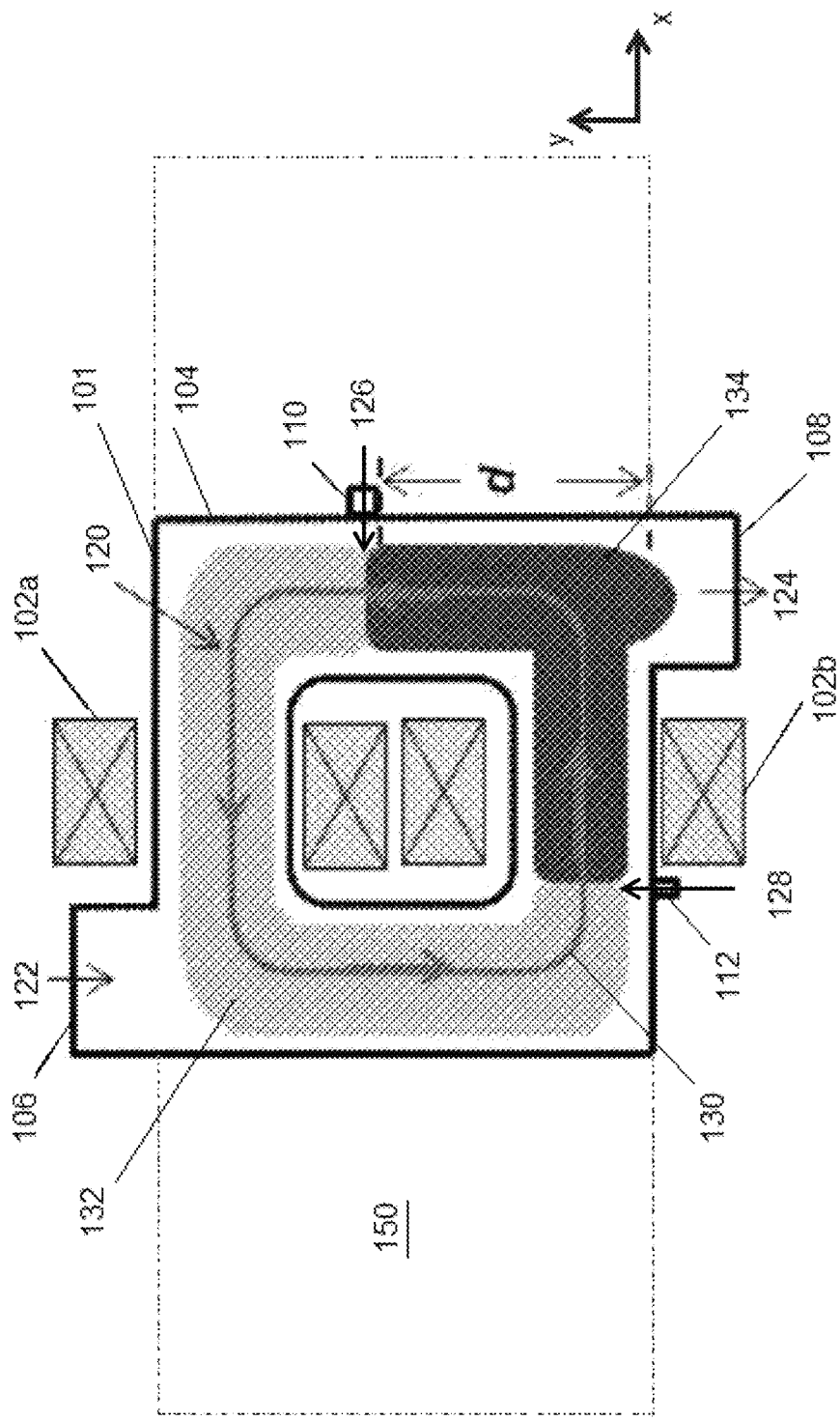
FIG. 2 is a schematic cross-sectional representation of a plasma chamber, according to an illustrative embodiment of the invention.

FIG. 2 is a schematic cross-sectional representation of a plasma chamber, according to an illustrative embodiment of the invention. Magnetic cores 102a and 102b are disposed relative to a plasma chamber 101, such that the plasma chamber 101 passes through each of the magnetic cores 102a and 102b.

The plasma chamber 101 includes a chamber wall 104, a first gas inlet 106, a second gas inlet 110, a third gas inlet 112 and a gas outlet 108. In some embodiments, the third gas inlet 112 is not included with the plasma source 100. In some embodiments, more than three gas inlets can be positioned along the plasma chamber 101 for introducing process gases, including inert gases, reactive gases, and/or gases to be abated, to the plasma chamber 101. In various embodiments, the second gas inlet 110 can consist of a series of selectable gas inlet ports positioned along the toroidal plasma chamber.

The plasma chamber 101 includes a first gas flow path 122 from the first gas inlet 106, a second gas flow path 126 from the second gas inlet 110, and a third gas flow path 128 from the third gas inlet 112. The plasma chamber 101 includes a gas outlet flow path 124 from the gas outlet 108.

During operation, a toroidal plasma 120 that forms within the plasma chamber 101 flows substantially within a loop (e.g., circle or oval) on a plane 150. The plane 150 extends along an x axis and a y axis as shown in FIG. 2. It is apparent to one of ordinary skill in the art that the boundaries on plane 150 shown in FIG. 2 are for illustration purposes only and that the plane 150 can extend beyond those boundaries.

The first gas inlet 106 is positioned on the plasma chamber 101 such that first gas flow path 122 is oriented substantially parallel to the plane 150. In some embodiments, the first gas flow path 122 is oriented substantially perpendicular to the plane 150. The first gas flow path 122 can also be oriented at an acute angle relative to the plane 150. The second gas inlet 110 is positioned on the plasma chamber 101 at a distance d from the gas outlet 108. In some embodiments, the second gas flow path 126 is oriented at an acute angle relative to the plane 150. In some embodiments, the second gas flow path 126 is oriented to form a helical gas flow in the plasma chamber 101 to increase interactions of gases to be abated with the plasma 120. The third gas inlet is positioned on the plasma chamber 101 at a distance d from the gas outlet 108. In some embodiments, the third gas flow path 128 is oriented substantially parallel to the plane 150. In some embodiments, the third gas flow path 128 is oriented at an acute angle relative to the plane 150. In some embodiments, the third gas flow path 128 is oriented to form a helical gas flow in the plasma chamber 101 to increase interactions of gases to be abated with the plasma 120.

The position of the gas inlets, such as the second gas inlet 110 and the third gas inlet 112, can be based on a desired reactive plasma volume and/or residence time of the gas to be abated. The desired reactive plasma volume and/or residence time can allow optimization of gas abatement efficiency and/or energy efficiency.

In operation, an inert gas, such as argon, can be inserted into plasma chamber 101 along the first gas flow path 122 from the first gas inlet 106 to ignite and sustain the toroidal plasma. The toroidal plasma and the toroidal plasma current 130 flow in a loop around the plasma chamber 101. A process gas to be abated is inserted into plasma chamber 101 along the second gas flow path 126 from the second gas inlet 110. Chlorine compounds and perfluoroncarbon compounds, such as carbon tetrafluoride, are examples of process gases that can be inserted via the second gas inlet 110 for abatement. Additional reactant gases, such as oxygen, hydrogen, and water vapor, can be fed into plasma chamber 101 together with the gases to be abated through the second gas inlets 126 and the third gas inlet 128. In some embodiments, the reactant gases are fed into the plasma chamber 101 through additional gas inlets positioned along the plasma chamber 101.

In a toroidal plasma source shown in FIG. 2, the circumference length of the plasma chamber 101 or the length of the plasma 120 can be based on the size of the magnetic core 102. The size of the magnetic core can be dependent on the electric voltages required to ignite and sustain the plasma as well as the properties of magnetic materials. For abatement applications, the desired volume of plasma for interacting with the gas to be abated can be based on the rates of gas excitation, chemical reactions in the plasma, and/or the gas resident time in the plasma. Too short a residence time can result in an insufficient gas-plasma interaction and/or low abatement rate, while too long a residence time can result in overheating of gases and low energy efficiency. In some embodiments, the required plasma volume is smaller than the overall volume of the toroidal plasma.

In the exemplary embodiment shown in FIG. 2, a first volume 132 between the first gas inlet 106 and the second gas inlet 110 is filled primarily with the inert gas. A second volume 134 between the second gas inlet 126 and the third gas inlet 112 is filled primarily with the gas to be abated. Filling the first volume 132 with the inert gas can decrease the second volume 134. The inert gas can have lower plasma impedance compared to the plasma impedance of the gas to be abated. With the plasma current 130 a constant along the toroidal plasma 120, lower impedance in the first volume 132 can allow for the power coupled to the toroidal plasma to be delivered to the portion of the toroidal plasma that interacts with the gas to be abated. By focusing the power delivered to the toroidal plasma to the second volume 134, the gas abatement can be more efficient. One or more reactant gases can be mixed with the gas to be abated prior to entering the plasma chamber 101 via the second gas inlet 110. In some embodiments, reactant gases are delivered at other ports located near the second volume 134. The one or more reactant gases can improve abatement efficiency. In some embodiments, water vapor is mixed with the gas to be abated.

Figure 3:
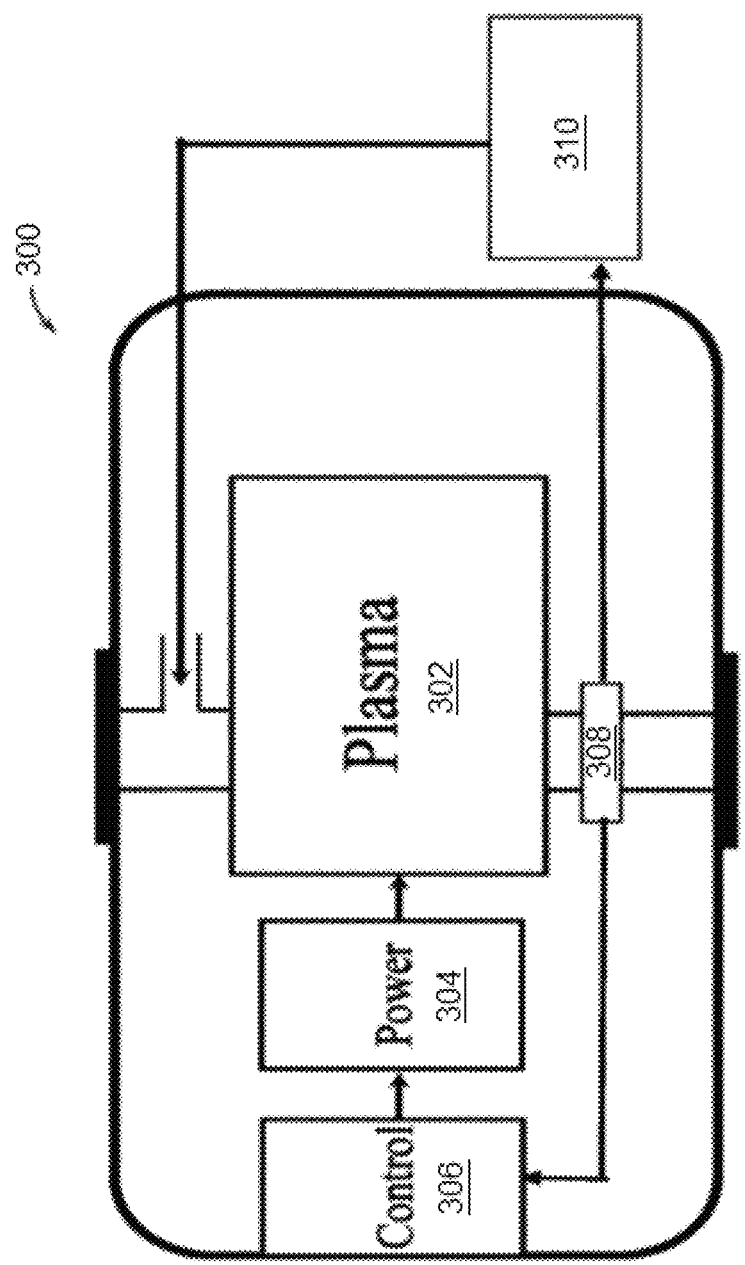
FIG. 3 is a schematic representation of a plasma abatement device, according to an illustrative embodiment of the invention.

FIG. 3 is a schematic representation of a plasma abatement device 300, according to an illustrative embodiment of the invention. Plasma abatement device 300 includes a plasma source 302, an RF power supply 304, a control module 306, a process monitoring sensor 308, and a reactant gas delivery system 310.

The plasma source 302 can include a plasma chamber (e.g., plasma chamber 101 as described above in FIG. 2).

The RF power supply 304 can be any RF power supply as is known by those of ordinary skill in the art capable of delivering sufficient power for plasma abatement processing (e.g., voltage supply 24 as described above in FIG. 1).

The process monitoring sensor 308 can be positioned and configured to monitor gas emissions flowing from the outlet of plasma source 302. In some embodiments, process monitoring sensor 308 is an optical sensor, an infrared sensor, and/or any sensor known to those skilled in the art to monitor gas emissions flowing from the plasma source 302.

The control module 306 can be coupled to the process monitoring sensor 308 and the RF power supply 304, and can be any microprocessor or other controller known to those skilled in the art for controlling and/or monitoring a power system. In some embodiments, the control module 306 is also coupled to the reactant gas delivery system 310. The reactant gas delivery system 310 can be any reactant gas delivery system or device known to those skilled in the art to deliver a chemical to a process chamber. In various embodiments, the reactant gas delivery system 310 provides a water vapor to the plasma source 302.

During operation, an abatement process can be monitored by the process monitoring sensor 308 and controlled by the control module 306 through measuring the input and output gas parameters of the abatement device 300, as well as the parameters of the plasma source 302 and the RF power supply 304. The process monitoring sensor 308 can sense and/or measure optical emissions from a toroidal plasma and from gases that are downstream of the toroidal plasma. The measured emission spectra can be compared with a reference spectra. The reference spectra can be from a look-up table and/or a spectra measured previously under standard process conditions and stored in the abatement device 300. For example, the look up table and/or measure spectra can be stored in the control module 306 and used to determine desired gas and plasma conditions (e.g., intensity) of the plasma source 302.

The flow of chemical reactants into and out of the plasma source 302 can be adjusted by the control module 306. The control module 308 can control the gas flow such that the concentration of the reactants is substantially stoichiometrically equal to or greater than the concentration that is desired to react with the process gas to be abated. The RF power supply 304 can also be adjusted (e.g., by control module 308) such that the concentration of unreacted gas exiting the plasma source 302 can be substantially below a predetermined level. The power can be maintained to achieve a desired abatement level, e.g., an abatement level that results in maximum energy efficiency (e.g., 3-6 kW for 100-200 sccm of CF4) can be achieved. Monitoring and controlling of the flow of chemical reactants and RF power can be particularly important for an abatement system with intermittent flows of gases to be abated. In semiconductor processing, for example, the flow of gases to be abated can follow each wafer cycle, which can range from a few seconds to a few minutes. The energy efficiency of the abatement system can improve when power and/or the reactant flow are controlled and/or adjusted during a cycle.

The chemical reactant delivered by the reactant gas delivery system 310 can be an oxidizing agent such as oxygen, a reducing agent such as hydrogen, or a combination of both. In some embodiments, a water vapor is delivered by the reactant gas delivery system and used for abatement of fluorocarbon compounds such as CF4. Such a reaction is illustrated as follows, where water vapor is mixed with CF4 and reaction is facilitated by the plasma:

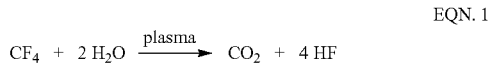

EQN. 1

The chemical reactants can also include a halogen-containing gas. A process gas can often include precursors used in chemical vapor deposition, which can contain compounds of silicon and carbon, and can be converted to halogen compounds during abatement.

Figure 4:
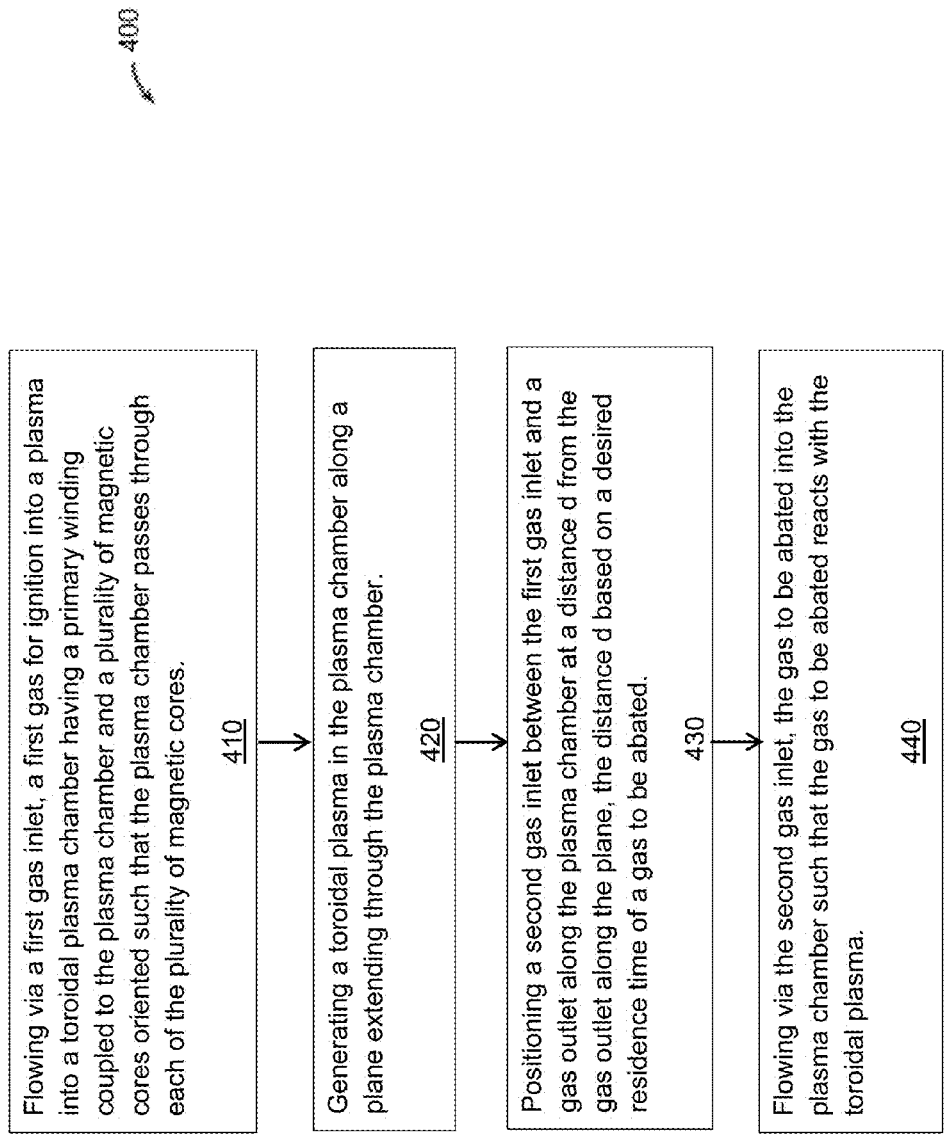
FIG. 4 is a flow chart showing a method for abating process gas within a plasma chamber, according to an illustrative embodiment of the invention.

FIG. 4 is a flow chart showing a method 400 for abating process gas within a plasma chamber, according to an illustrative embodiment of the invention. The method involves flowing via a first gas inlet (e.g., first gas inlet 106 as shown above in FIG. 2), a first gas for igniting a plasma in a plasma chamber (e.g., plasma chamber 101 as shown above in FIG. 2). (Step 410) The plasma chamber has a primary winding coupled to the plasma chamber and a plurality of magnetic cores oriented such that the plasma chamber passes through each of the plurality of magnetic cores. In some embodiments, the method further involves providing a reactant gas to mix with the gas to be abated before flowing into the plasma chamber via the second gas inlet (e.g., second gas inlet 110 as shown above in FIG. 2).

The method also involves generating a toroidal plasma in the plasma chamber along a plane that extends through the plasma chamber (e.g., plane 150 as shown above in FIG. 2) (Step 420). In some embodiments, the method further involves adjusting a flow rate of the first gas flowing into the plasma chamber to control distribution of power in the toroidal plasma.

The method also involves positioning a second gas inlet along the plasma chamber at a distance d from a gas outlet along the plane (e.g., gas outlet 108 as shown above in FIG. 2), the distance d based on a desired residence time of a gas to be abated (Step 430). In various embodiments, the method also involves adjusting the position of the second gas inlet to control the desired residence time of the gas to be abated.

The method also involves flowing via the second gas inlet, the gas to be abated into the plasma chamber such that the gas to be abated interacts with the toroidal plasma (Step 440). In some embodiments, the method further involves monitoring an emission from the plasma chamber via an optical and/or an infrared sensor and adjusting a flow rate of the reactant gas in response to the emission from the plasma chamber such that a concentration of the reactant gas is at a desired level to react with the gas to be abated, as well as the RF power such that sufficient abatement efficiency is achieved. The method can also involve coupling the gas outlet to a subsequent treatment device.

Figure 5A:
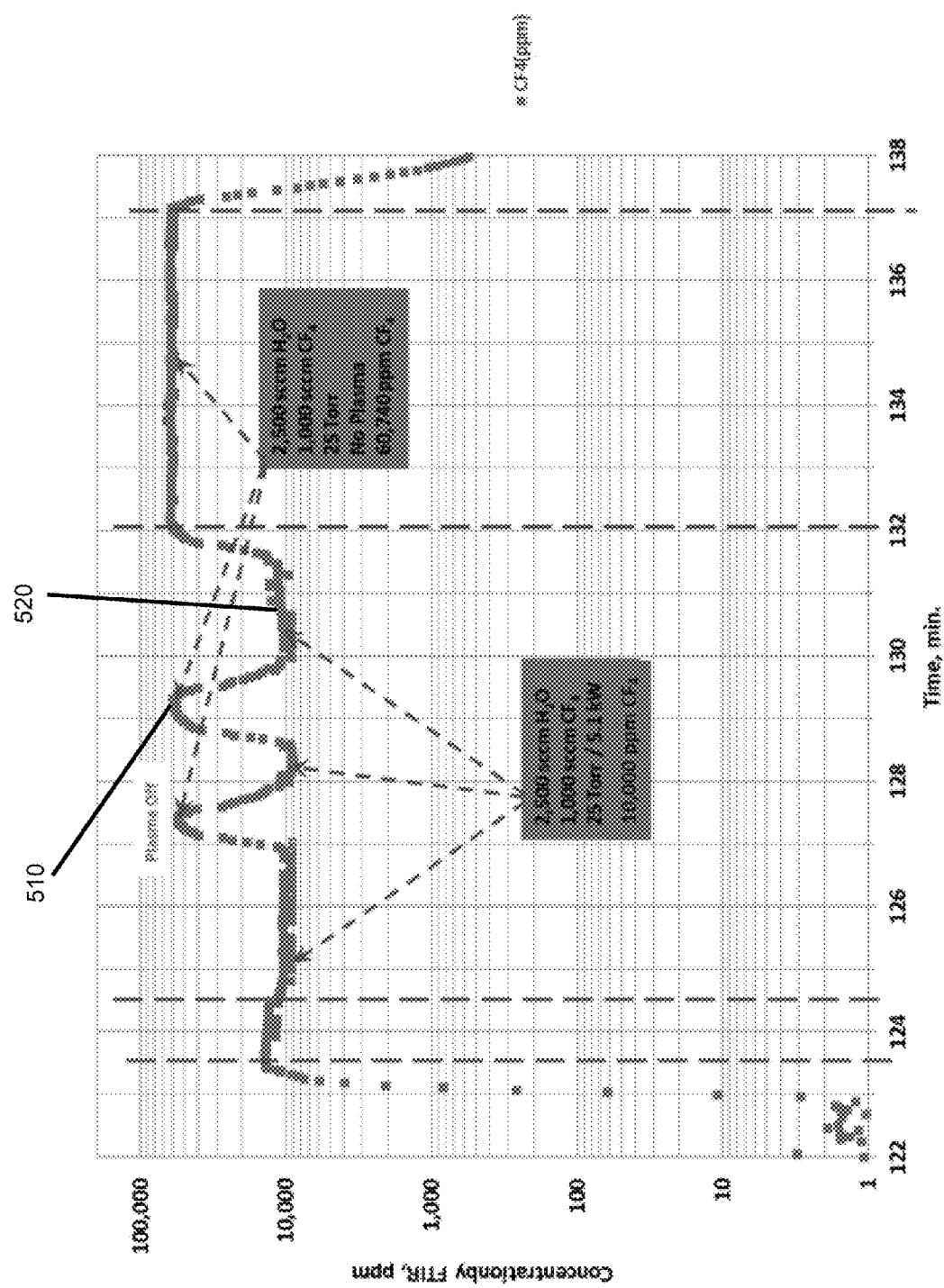
FIG. 5a is a graph showing CF4 concentration over time at a gas outlet of a plasma chamber, according to illustrative embodiments of the invention.
Figure 5B:
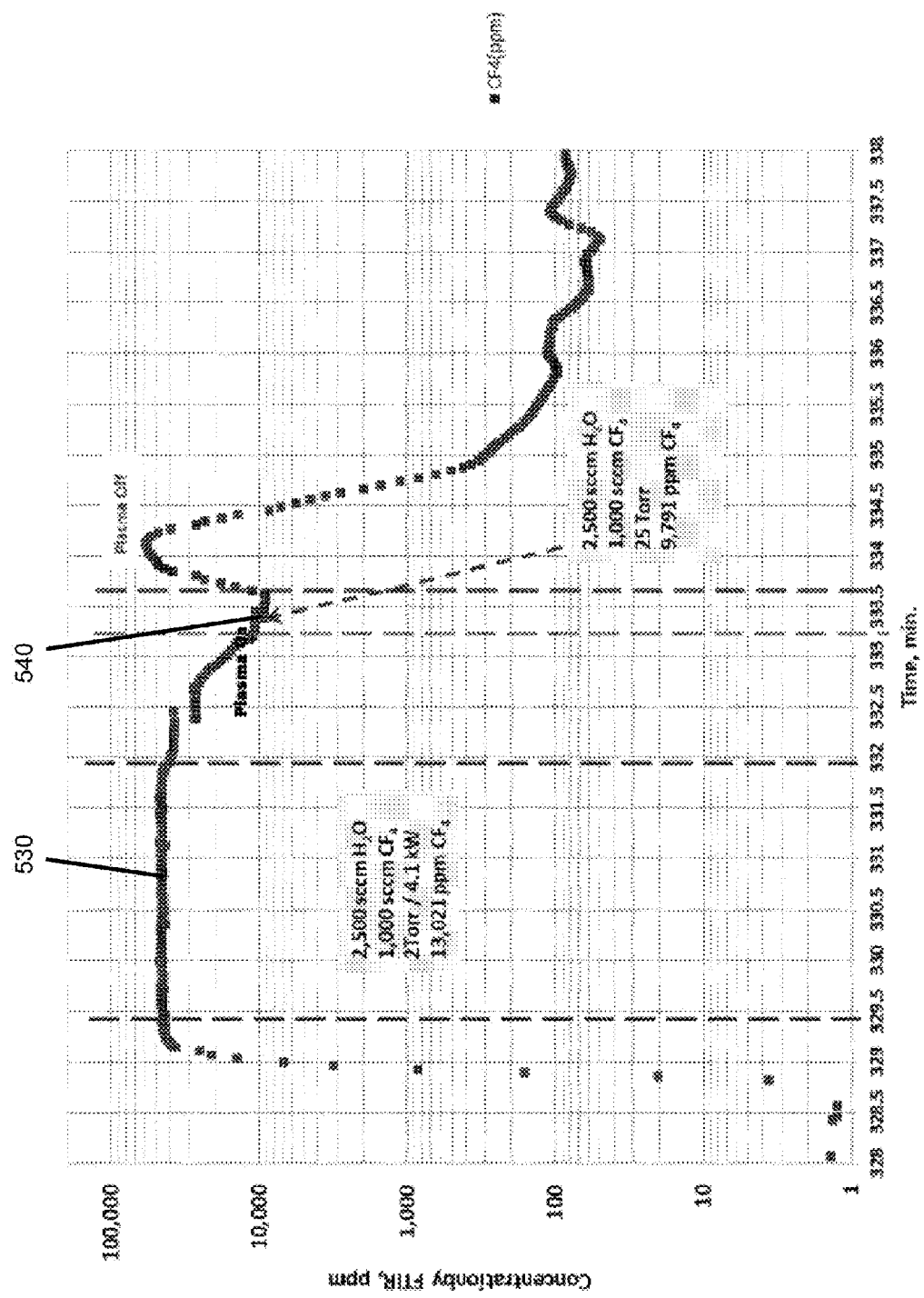
FIG. 5b is a graph showing CF4 concentration over time at a gas outlet of a plasma chamber, according to illustrative embodiments of the invention.
Figure 5C:
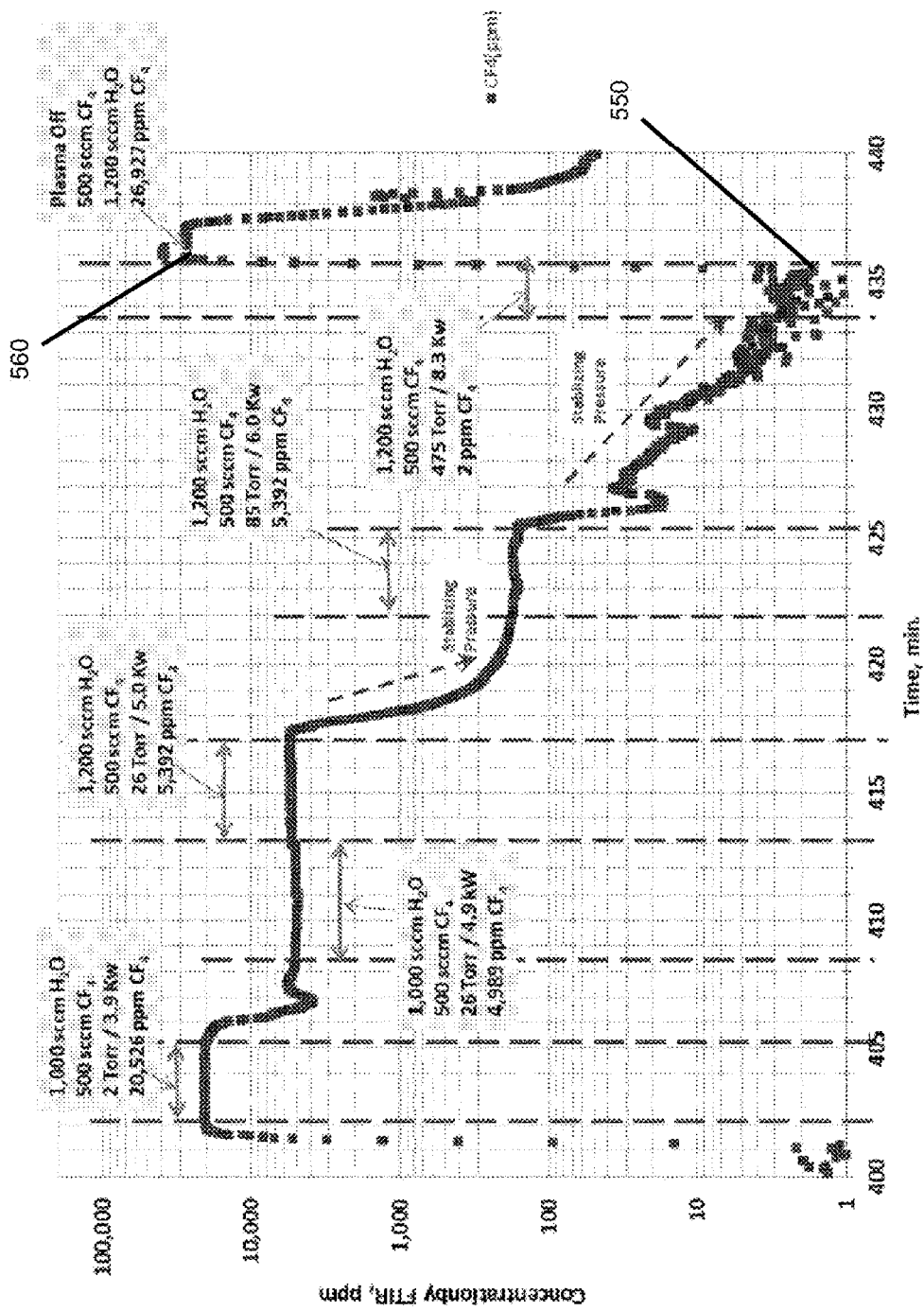
FIG. 5c is a graph showing CF4 concentration over time at a gas outlet of a plasma chamber, according to illustrative embodiments of the invention.

FIGS. 5a, 5b, and 5c are graphs 501, 502, and 503, respectively, showing CF4 concentration over time at the gas outlet of plasma chamber under various conditions, according to illustrative embodiments of the invention.

As shown in FIG. 5a, for a CF4 flow rate of 1,000 sccm and H2O flow rate of 2,500 sccm, at 25 Torr, CF4 concentration at the gas outlet of the plasma chamber is 60,740 ppm with no plasma (e.g., data point 510); CF4 concentration at the gas outlet is 10,000 ppm with plasma on at 5.1 kW (e.g., data point 520).

As shown in FIG. 5b, for a CF4 flow rate of 1,000 sccm and H2O flow rate of 2,500 sccm, at 2 Torr, CF4 concentration at the gas outlet is 13,021 ppm with plasma on at 4.1 kW (e.g., data point 530). For a CF4 flow rate of 1,000 sccm and H2O flow rate of 2,500 sccm, at 25 Torr, CF4 concentration at the gas outlet is 9,791 ppm (e.g., data point 540).

As shown in FIG. 5c, for a CF4 flow rate of 500 sccm and H2O flow rate of 1,200 sccm, at 475 Torr, CF4 concentration at the gas outlet is 2 ppm with plasma on at 8.3 kW (e.g., data point 550). For a CF4 flow rate of 500 seem and H2O flow rate of 1,200 seem, at 475 Torr, CF4 concentration at the gas outlet is 26,927 ppm with no plasma (e.g., data point 560).

Figure 6:
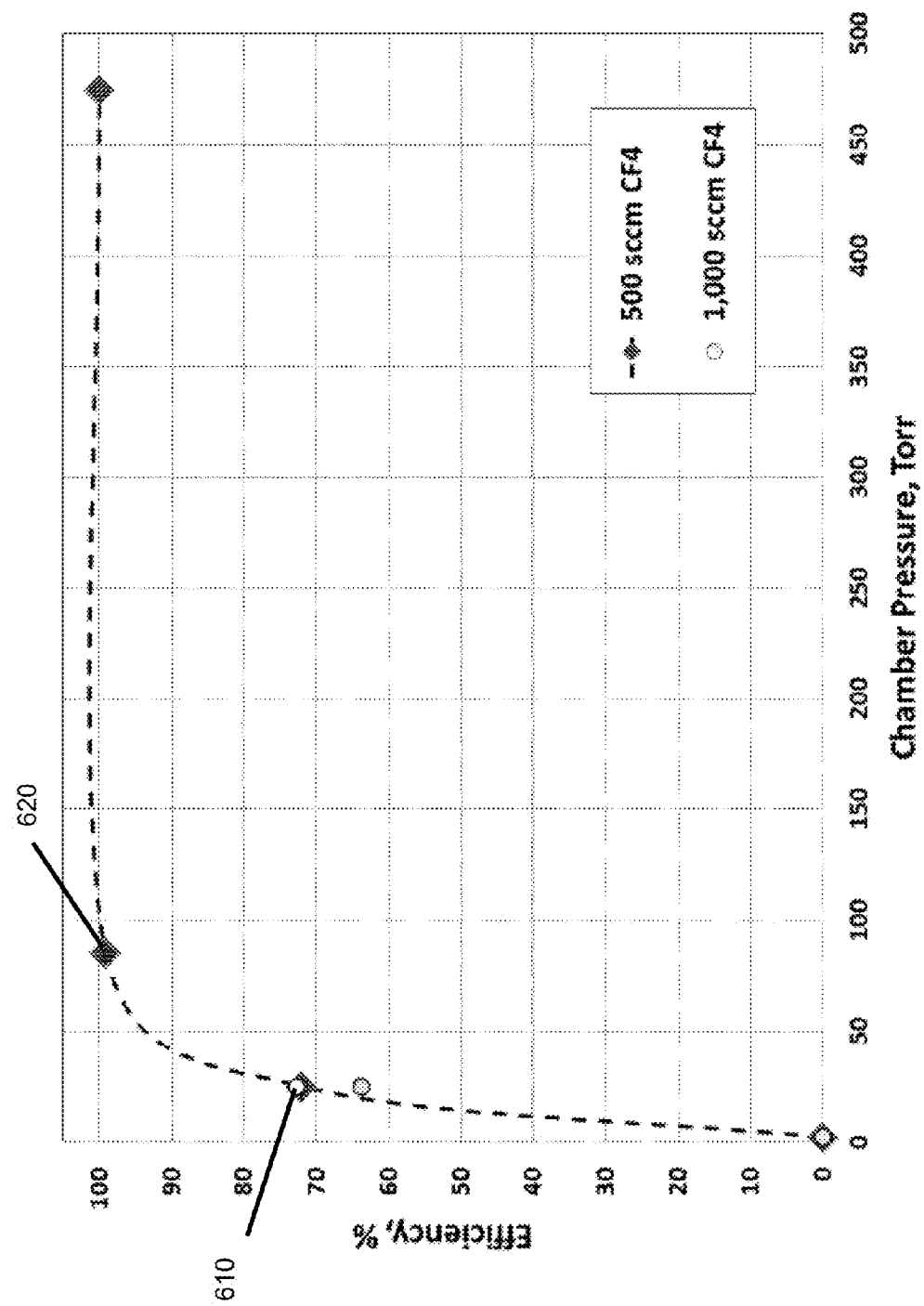
FIG. 6 is a graph showing CF4 destruction efficiency versus plasma chamber pressure, according to an illustrative embodiment of the invention.

FIG. 6 is a graph 600 showing CF4 destruction efficiency versus plasma chamber pressure, according to an illustrative embodiment of the invention. At a CF4 flow rate of 500 sccm, CF4 destruction efficiency at chamber pressure of 25 Torr is approximately 73% (e.g., data point 610). CF4 destruction efficiency at chamber pressure of 85 Torr is approximately 99% (e.g., data point 620).

Figure 7A:
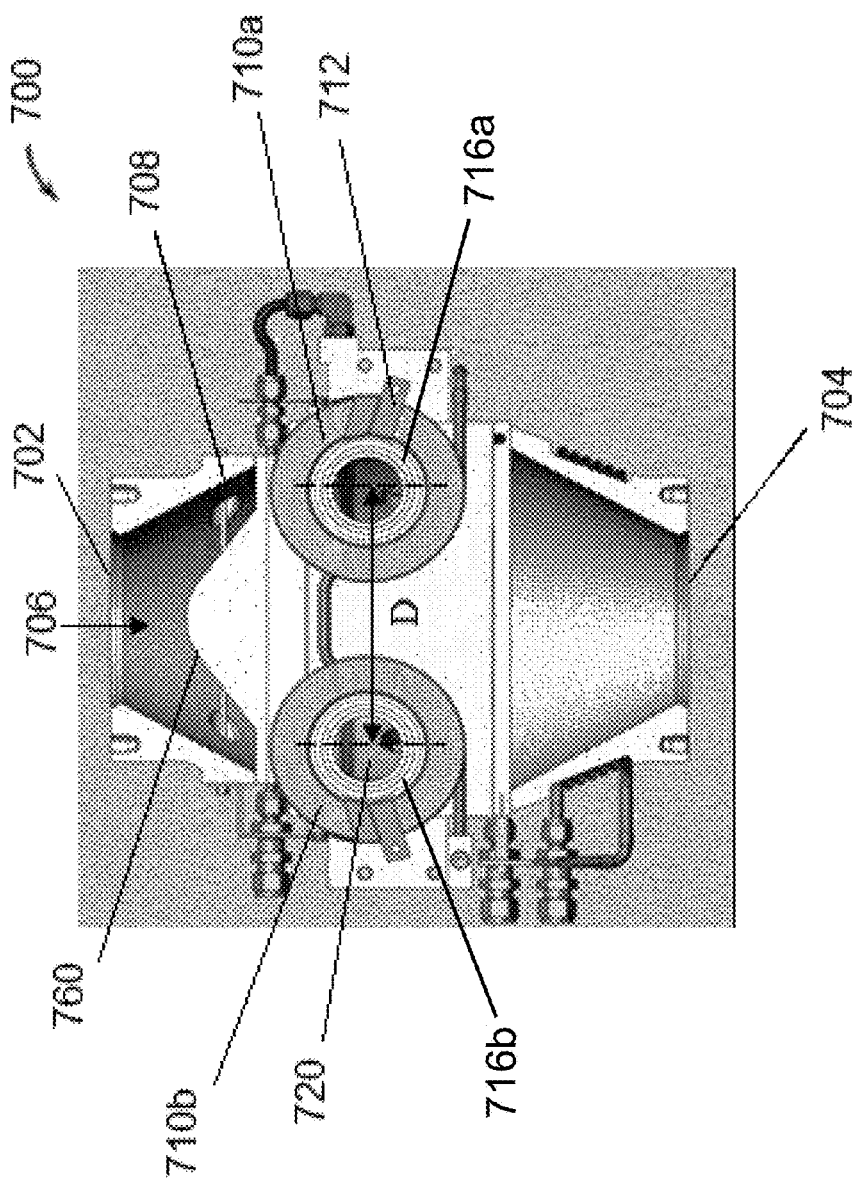
FIG. 7a is schematic cross-sectional representation of a plasma source, according to an illustrative embodiment of the invention.
Figure 7B:
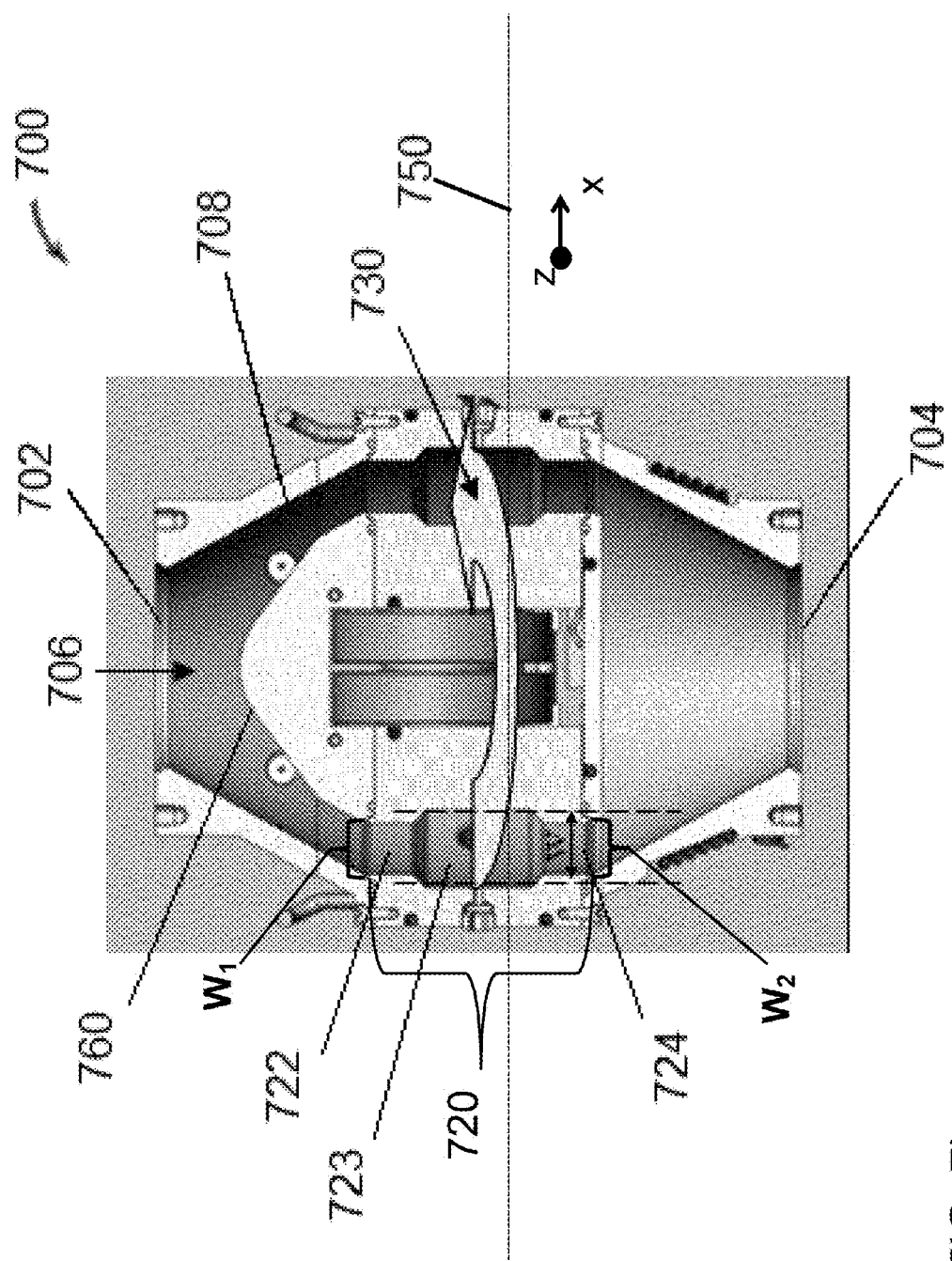
FIG. 7b is schematic cross-sectional representation of a plasma source, according to an illustrative embodiment of the invention.

FIGS. 7a and 7b are cross-sectional views of a high-conductance plasma source 700, according to an illustrative embodiment of the invention. Plasma source 700 includes a gas inlet 702, a gas outlet 704, a chamber wall 708, and a toroidal plasma channel 720. The toroidal plasma channel 720 includes a toroidal plasma channel inlet portion 722, a main toroidal plasma channel portion 723, and a toroidal plasma channel outlet portion 724.

In the toroidal plasma channel 720, the main toroidal plasma channel portion 723 is recessed into the chamber wall 708 such that a width $W_1$ of the toroidal plasma channel inlet portion 722 is less than the width W of the main toroidal plasma channel portion 723. A width $W_2$ of the toroidal plasma channel outlet portion 724 is less than the width W of the main toroidal plasma channel portion 723. In some embodiments, the width $W_1$ of the toroidal plasma channel inlet portion 722 is substantially equal to the width $W_2$ of the toroidal plasma channel outlet portion 724.

Magnetic cores 710a and 710b, generally 710, are disposed relative to the toroidal plasma channel 720, such that the toroidal plasma channel 720 passes through each of the magnetic cores 710. A primary winding 712 is coupled to at least one of the magnetic cores 710.

During operation, a toroidal plasma 730 that flows within the plasma source 700 flows substantially within a loop (e.g., circle or oval) on a plane 750. The plane 750 extends along an x axis and a z axis as shown in FIG. 7b, where the z axis projects outward from the page. It is apparent to one of ordinary skill in the art that the boundaries on plane 750 shown in FIG. 7b are for illustration purposes only and that the plane 750 can extend beyond those boundaries.

The plasma source 700 includes a gas flow path 706 from the gas inlet 702. The gas inlet 702 is positioned on plasma source 700 such that the gas flow path 706 is oriented substantially perpendicular to the plane 750 extending through the plasma source 700. In some embodiments, the cross-sectional area of the toroidal plasma channel 720, relative to the direction of gas flow, is approximately the product of the circumferential length of the plasma channel 720 and the width $W_1$ of the inlet portion 722 of the toroidal plasma channel. The cross-sectional area of the toroidal plasma channel can be based on a desired gas flow conductance and/or a desired gas-plasma interaction time for the abatement process. In some embodiments, the diameter of the toroidal plasma channel 720, D, is greater than or equal to the diameter of the gas inlet 702. In some embodiments, the cross-sectional area of the toroidal plasma channel 720, relative to the direction of gas flow, is greater than or equal to the cross-sectional area of the gas inlet 702. In some embodiments, the radius of gas inlet 702 is between approximately 1 and 4 inches.

The gas inlet 702 includes a curved portion 760 for guiding the gas flow 706 into the toroidal plasma channel 720. The curved portion 760 can be shaped to minimize skin friction and pressure drag along the gas flow path 706 from the gas inlet 702. The curved portion 760 can be shaped such that pressure rise within the entire plasma source 700 can be minimized.

Various shapes can be used for the curved portion 760. For example, for subsonic flows, the curved portion 760 can be an elliptically shaped cone, a tangent ogive cone, and/or a spherically blunted cone. In another example, for transonic flows, a Von Kármán ogive cone and/or a parabola cone can be used.

In operation, an inert gas, such as argon, can be inserted into the plasma source 700 along the gas flow path 706 from the gas inlet 702 to ignite and sustain the toroidal plasma 730 that flows in a loop within the toroidal plasma channel 720, with most of plasma in the main plasma channel portion 723. A gas to be abated is directed into the plasma source 700 along the gas flow path 706 from the gas inlet 702. The gas to be abated flows along the curved portion 760 to enter the toroidal plasma channel 720 through the toroidal plasma channel inlet portion 722. The main toroidal plasma channel portion 723 is recessed, as described above, such that the gas to be abated is directed to interact with a region of the toroidal plasma 730 having a substantially peaking electron density (e.g., an electron density of $10^{12}$ $cm^{-3}$). Less gas is flowed to the edge of plasma or the plasma-wall boundary region where electron density decreases due to plasma loss to the walls, as the boundaries of the plasma remains in the recessed edges of the main toroidal plasma channel portion 723. The gas exits the main toroidal plasma channel portion 723 through the toroidal plasma channel outlet portion 724. The gas can exit the plasma source 700 through the gas outlet 704.

The width W of the main toroidal plasma channel portion 723 can be based on a diffusion length of the toroidal plasma 730 at normal operating conditions. The width W of the main toroidal plasma channel portion can be based on the width required to fill the main toroidal plasma channel portion 723 with the toroidal plasma 730 during described operation.

The width W of the main toroidal plasma channel portion 723 can also be based on type of gas to be abated, pressure and flow rate of the gas, and/or diffusion lengths of electrons and/or ions in the plasma channel.

The width W of the main toroidal plasma channel portion 723 can be approximately equal to a natural width of the toroidal plasma 730 (e.g., width of the plasma without the presence of walls). The diffusion lengths of electrons and ions in the plasma channel can decrease with increasing pressure and can also decrease in electronegative gases. When the width W of the main toroidal plasma channel portion 723 is narrower than the natural width of the toroidal plasma 730, the plasma source can be inefficient due to high rate of loss of plasmas near the walls. When the width W of the main toroidal plasma channel portion 723 is wider than the natural width of the toroidal plasma 730, the plasma can exist only in a portion of the main toroidal plasma channel portion 723, allowing part of gas to be abated to flow through the toroidal plasma channel 720 without being activated and reacted, thereby reducing the abatement efficiency.

In some embodiments, a depth of the recess (e.g., the difference between the width $W_1$ of the toroidal plasma channel inlet portion 722 and the width W of the main toroidal plasma channel portion 723) is approximately equal to a thickness of a boundary layer of the toroidal plasma 730. Having a depth of the recess approximately equal to the thickness of the boundary layer can allow for most of the gas to be abated to flow through a region of toroidal plasma 730 where the plasma density is high. For example, for a gas containing fluorocarbon and oxygen at pressure of 0.1-0.5 Torr, a width W of the toroidal plasma channel 720 can be 30 mm, with a depth of recess of 5 mm. For other applications, the optimal width W of the toroidal plasma channel 720 can range from 10 mm to 50 mm, with an optimal depth of recess ranging from 1 mm to 20 mm.

In some embodiments, the toroidal plasma channel 720 is made of a metal such as aluminum, with its surface covered by a protective coating. In some embodiments, electrostatic coupling is shielded by the metallic layer of toroidal plasma channel 720. The protective coating can be a layer of chemically stable dielectric, such as Y2O3, an anodized coating on aluminum, or an oxide layer formed via Plasma Electrolytic Oxidation. The inductively-coupled, low-field toroidal plasma 730 can be operated at electric fields of 2-10 V/cm to eliminate energetic ions and to reduce ion-induced erosion. In some embodiments, one or more dielectric gaps (e.g. dielectric gasps 716a and 716b shown in FIG. 7a) along the toroidal plasma channel 720 prevent induced electric current from flowing along the toroidal plasma channel 720. The induced electric voltage across each dielectric gap can be limited to below 100 V.

Abatement efficiency can depend on the rates of gas excitation, chemical reactions, and the time of the gases staying within the volume of toroidal plasma 730. Toroidal plasma 730 flowing in the toroidal plasma channel 730 can excite, heat, or dissociate the gases to be abated and raise chemical reactivity of the gases. The gas residence time in the volume of toroidal plasma 730 is proportional to the plasma volume V, as follows:

$$t = \frac{V}{S} \approx \frac{\pi Dw^2}{S}, \text{ where } S = \frac{dv}{dt}$$

is the pump speed.

For plasma abatement, the gas residence time t can be of the order of the gas chemical reaction time. If the residence time is too short, the abatement efficiency can suffer as there can be insufficient time for the gases to be activated and reacted in the toroidal plasma 730. If the residence time is too long, the energy efficiency can reduce as power can be consumed in re-heating and re-activating the reacted species.

The circumference or major diameter D of the toroidal plasma channel 720 can based on a desired volume of toroidal plasma 730 and/or desired abatement efficiency. While the width W of the main toroidal plasma channel portion 723 can be determined by the width of the toroidal plasma 730, there is no such a limitation on the major diameter D of the plasma channel. For example, for a toroidal plasma abatement device to match or exceed the flow conductance of a pipe line of diameter x, the major diameter of the toroidal plasma channel 720 can be selected by $D > x^2/4W$, so that the cross sectional area of the toroidal plasma channel in the direction of the gas flow exceeds the cross sectional area of the pipe line. In addition, the major diameter D of the toroidal plasma channel 720 can be selected to achieve a desired gas residence time t in the plasma, as the volume of the plasma in the toroidal plasma channel 720 is approximately $V \approx \pi D w^2$.

Figure 8:
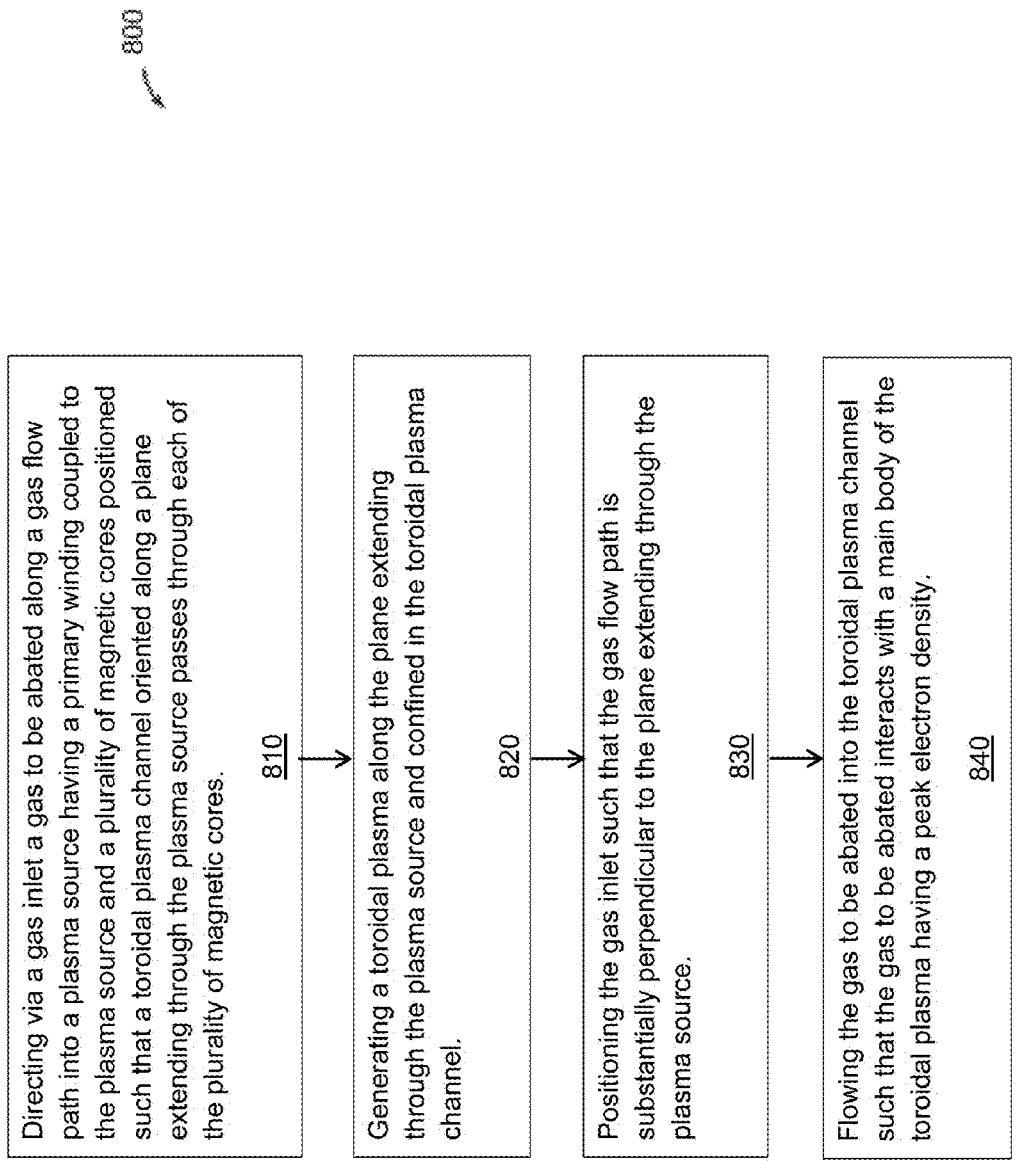
FIG. 8 is a flow chart showing a method for abating process gas within a plasma source, according to an illustrative embodiment of the invention.

FIG. 8 is a flow chart showing a method 800 for abating process gas within a plasma source, according to an illustrative embodiment of the invention. The method involves directing via a gas inlet (e.g., gas inlet 702 as shown above in FIGS. 7a and 7b) a gas to be abated along a gas flow path (e.g., gas flow path 706 as shown above in FIGS. 7a and 7b) into a plasma source (e.g., plasma source 700 as shown above in FIGS. 7a and 7b). The plasma source has a primary winding coupled to the plasma source and a plurality of magnetic cores positioned such that a toroidal plasma channel oriented along a plane that extends through the plasma source passes through each of the plurality of magnetic cores (Step 810).

The method also involves generating a toroidal plasma along the plane that extends through the plasma source and confined in the toroidal plasma channel (e.g., toroidal plasma channel 720 as shown above in FIG. 7b) (Step 820). In various embodiments, the method also involves positioning one or more dielectric gaps along the toroidal plasma channel to prevent an induced electric current from flowing in the toroidal plasma channel.

The method also involves positioning the gas inlet such that the gas flow path is substantially perpendicular to the plane extending through the plasma source (e.g., plane 750 as shown above in FIG. 7b) (Step 830).

The method also involves flowing the gas to be abated into the toroidal plasma channel such that the gas to be abated interacts with a main body of the toroidal plasma having a peak electron density (Step 840). In some embodiments, the method also involves providing one or more reactant gases to mix with the gas to be abated prior to the gas to be abated entering the toroidal plasma channel.

Figure 9A:
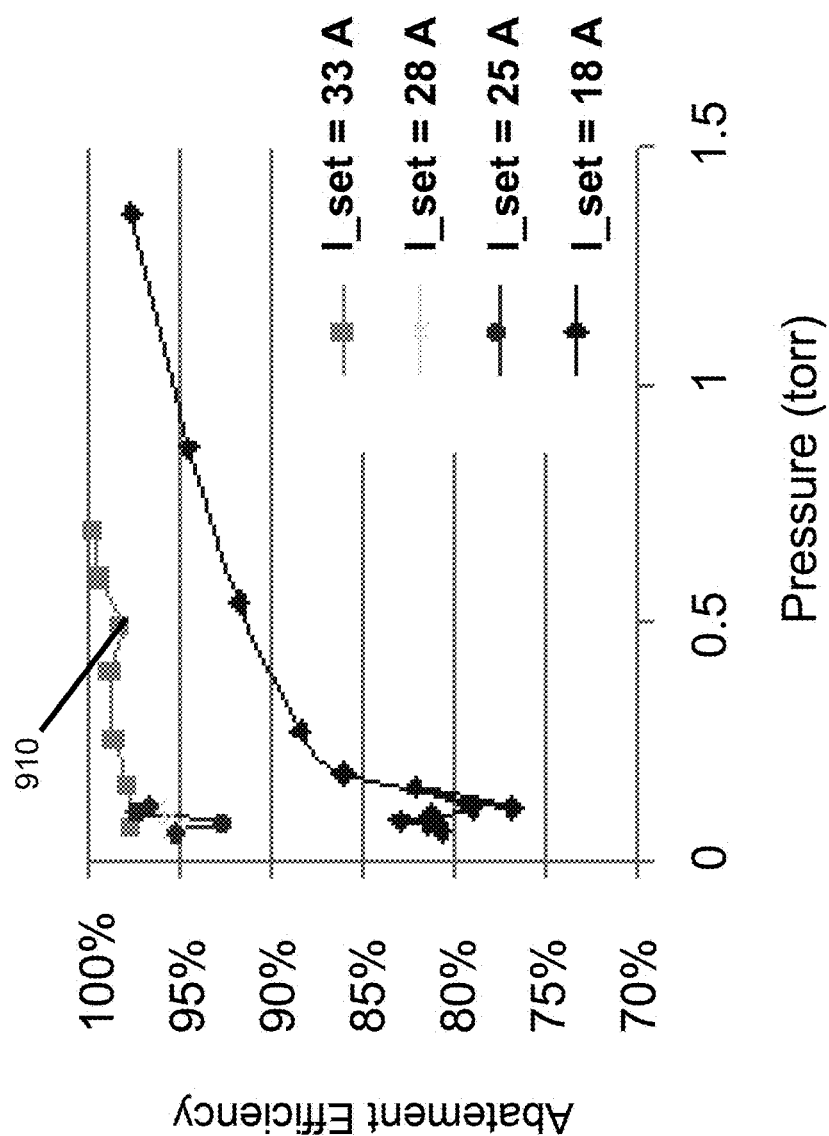
FIG. 9a is a graph showing abatement rate versus pressure, according to illustrative embodiments of the invention.
Figure 9B:
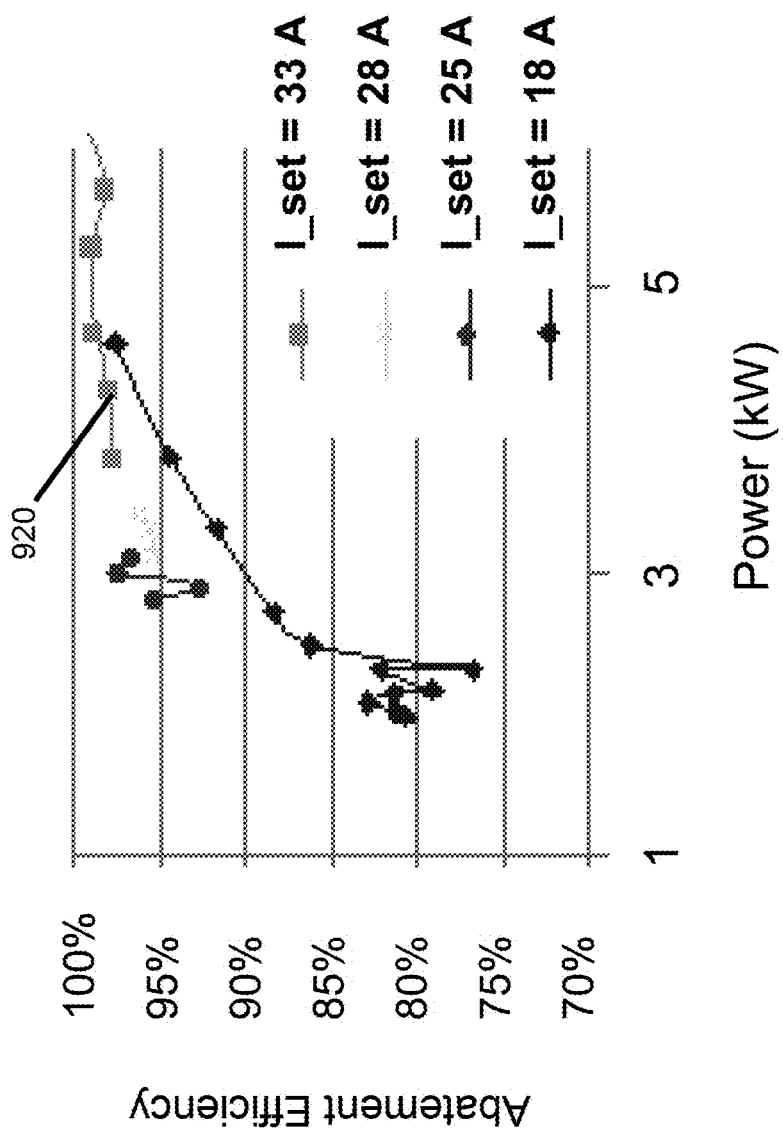
FIG. 9b is a graph showing abatement rate versus power, according to illustrative embodiments of the invention.

FIGS. 9a and 9b are graphs showing abatement rate versus pressure and power, according to illustrative embodiments of the invention. The magnitude of plasma current, to the first order, can be proportional to the density of plasma in the toroidal plasma channel. The plasma current can be controlled by adjusting the RF power supply that powers the plasma source. Higher plasma density increases the rate of gas-plasma reactions and the abatement rate of the gas to be abated. Excess plasma current, however, decreases the energy efficiency of the abatement process. A preferred abatement efficiency can range from 80% to 100%, depending upon the type of gas to be abated.

As shown in FIG. 9a, at a CF4 flow rate of 100 sccm, CF4 abatement efficiency at source pressure of approximately 0.5 Torr is approximately 98% for a plasma current of 33 A (e.g., data point 910).

As shown in FIG. 9b, CF4 abatement efficiency at source power of approximately 4 kW is approximately 97% for a plasma current of 33 A (e.g., data point 920).

Figure 9C:
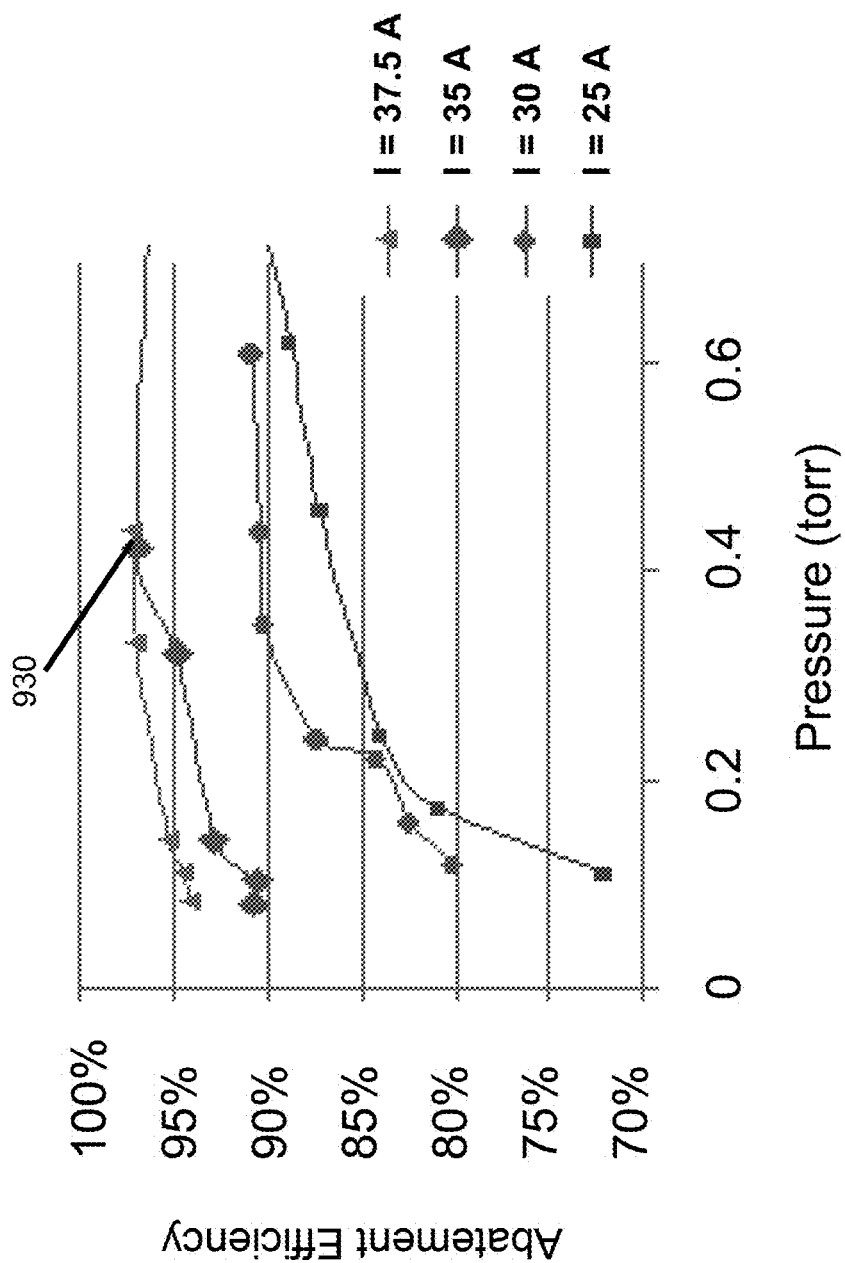
FIG. 9c is a graph showing abatement efficiency versus pressure, according to illustrative embodiments of the invention.
Figure 9D:
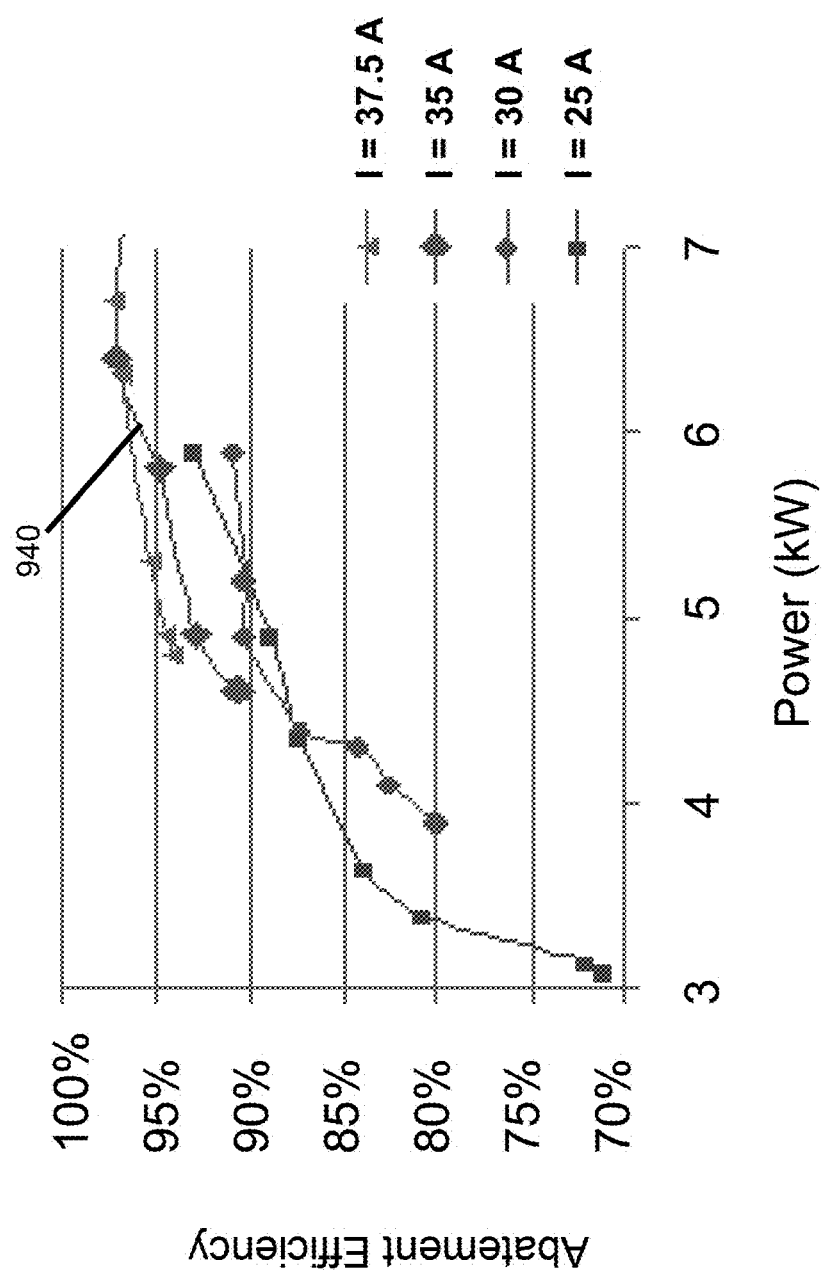
FIG. 9d is a graph showing abatement efficiency versus power, according to illustrative embodiments of the invention.

FIGS. 9c and 9d are graphs showing abatement rate versus pressure and power, according to illustrative embodiments of the invention.

As shown in FIG. 9c, at a CF4 flow rate of 200 sccm, CF4 abatement efficiency at source pressure of approximately 0.4 Torr is approximately 97% for a plasma current of 37.5 A (e.g., data point 930).

As shown in FIG. 9d, CF4 abatement efficiency at source power of approximately 6 kW is approximately 97% for a plasma current of 37.5 A (e.g., data point 940).

The invention can be used for reducing PFC emissions from microelectronics manufacturing processes, particularly from dielectric etch and CVD tools. The invention can be used to abate gases to remove unwanted species in a gas stream. It can also be used for decomposing CVD precursors inside or upstream of a process chamber to assist deposition. It can be used in chemical plants to abate harmful gases before releasing to atmosphere.

While the invention has been particularly shown and described with reference to specific embodiments, it should be understood by those skilled in the art that various changes in form and detail can be made therein without departing from the spirit and scope of the invention as defined by the appended claims.

What is claimed is:

1. An apparatus for abatement of gases, the apparatus comprising:
    a toroidal plasma chamber having a first gas inlet receiving an inert gas for ignition into a plasma, a second gas inlet receiving a gas to be abated, a gas outlet, and at least one chamber wall for containing the gases;
    one or more magnetic cores disposed relative to the toroidal plasma chamber such that the toroidal plasma chamber passes through each of the one or more magnetic cores; and
    a primary winding coupled to the one or more magnetic cores; and
    an RF power supply coupled to the primary winding for delivering power to a toroidal plasma,
    the toroidal plasma chamber confining the toroidal plasma along a plane extending through the toroidal plasma chamber,
    wherein the second gas inlet is positioned between the first gas inlet and the gas outlet at a distance d from the gas outlet along the plane such that a first toroidal plasma channel volume between the first gas inlet and the second gas inlet in the toroidal plasma chamber is substantially filled by the inert gas and a second toroidal plasma channel volume between the second gas inlet and the gas outlet is substantially filled with the gas to be abated, the distance d based on a desired residence time of the gas to be abated, wherein the RF power supply is configured to deliver a constant plasma current through the first plasma channel volume and the second plasma channel volume, wherein the second gas inlet is oriented at an acute angle to the plane, and wherein the distance d is approximately 2 to 5 inches.

2. The apparatus of claim 1, wherein the second gas inlet is a series of selectable gas inlet ports positioned along the toroidal plasma chamber.

3. The apparatus of claim 1, wherein the gas to be abated is mixed with one or more reactant gases prior to entering the toroidal plasma chamber.

4. The apparatus of claim 3, wherein the one or more reactant gases mixed with the gas to be abated is a water vapor.

5. The apparatus of claim 1, further comprising a sensor positioned relative to the gas outlet and configured to monitor an emission from the toroidal plasma chamber.

6. The apparatus of claim 5, wherein the sensor comprises an optical and/or an infrared sensor.

7. The apparatus of claim 1, wherein the gas to be abated received by the second gas inlet is a chlorine compound.

8. The apparatus of claim 1, wherein the gas to be abated received by the second gas inlet is a perfluorocarbon compound.

9. The apparatus of claim 8, wherein the perfluorocarbon compound received by the second gas inlet includes carbon tetrafluoride.

\* \* \* \* \*